United States Patent
Moss

[11] Patent Number: 4,471,327
[45] Date of Patent: Sep. 11, 1984

[54] SELF-OSCILLATING POWER SUPPLY

[75] Inventor: Timothy B. Moss, Chicago, Ill.

[73] Assignee: Zenith Electronics Corporation, Glenview, Ill.

[21] Appl. No.: 379,850

[22] Filed: May 20, 1982

[51] Int. Cl.³ .............................................. H03K 3/28
[52] U.S. Cl. ................................ 331/111; 331/117 R; 363/18; 363/49
[58] Field of Search ................... 331/111, 112, 113 A, 331/117 R; 363/16, 18, 19, 49, 131

[56] References Cited

U.S. PATENT DOCUMENTS

| | | | |
|---|---|---|---|
| 3,076,945 | 2/1963 | Coombs | 331/117 R |
| 3,882,422 | 5/1975 | Freed | 331/117 R X |
| 4,009,454 | 2/1977 | Darrow | 331/117 R |
| 4,385,347 | 5/1983 | Takematsu | 363/49 |

Primary Examiner—Siegfried H. Grimm

[57] ABSTRACT

A self-oscillating circuit particularly adapted for driving the deflection yoke of a cathode ray tube (CRT) or a high voltage pulse transformer is disclosed. The circuit includes an NPN transistor, to the collector of which is coupled a direct voltage source and a first inductance and to the base of which is coupled a second, grounded inductance. Following transistor turn-on, the collector current ramps up in storing energy in the first inductance. With the transistor base drive removed, a voltage spike appears on the transistor's collector to which is coupled a grounded capacitor. The LC network comprised of the first inductance and the grounded capacitance attempts to resonate, with the collector voltage clamped by the transistor collector-base junction. The energy stored in the first inductance flows via the grounded voltage source and the collector-base junction of the forward biased transistor into the second inductance until the energy stored in the first inductance has been reduced to the point where the transistor's collector-base junction is no longer forward biased. Continued current flow through the second inductance to the transistor's base turns the transistor on, causing current to be reversed in the first inductance in repeating the cycle as energy is again stored therein. Transistor base drive stops when the energy in the second inductance is depleted. The values of a resistance in series with the second inductance and the aforementioned capacitance determine the circuit's oscillatory period.

11 Claims, 7 Drawing Figures

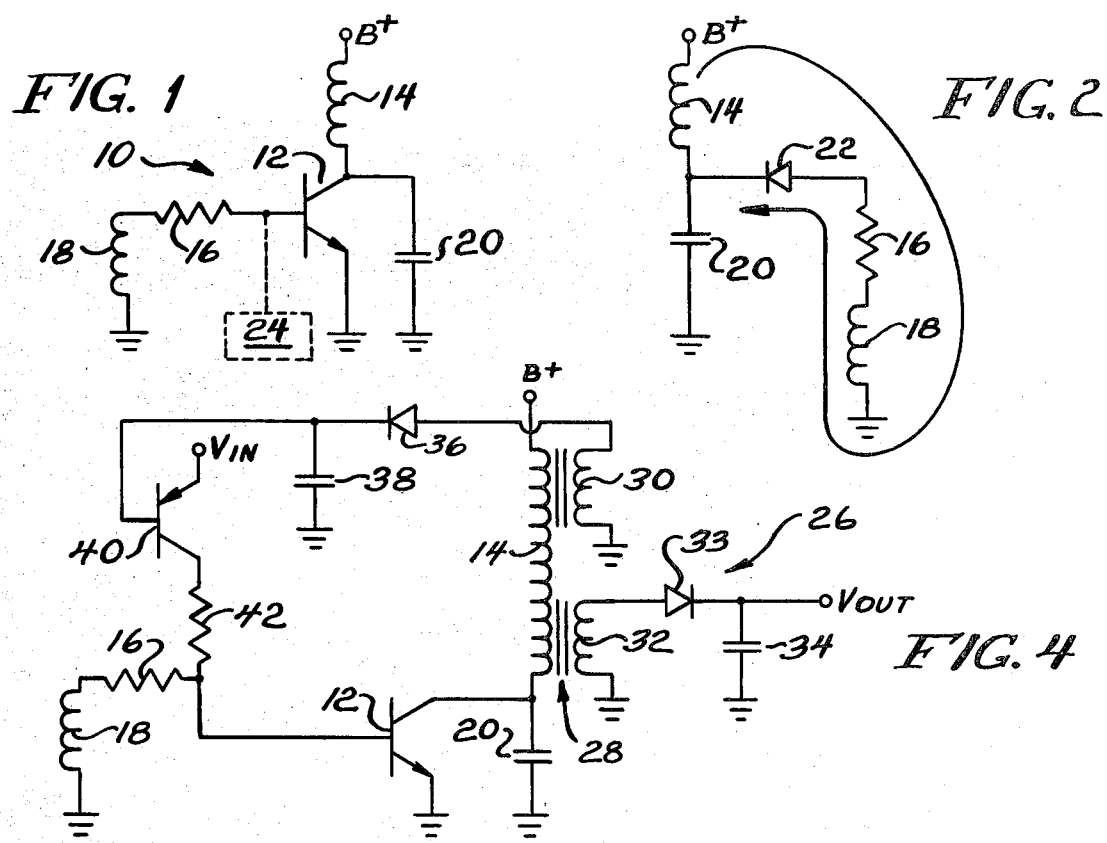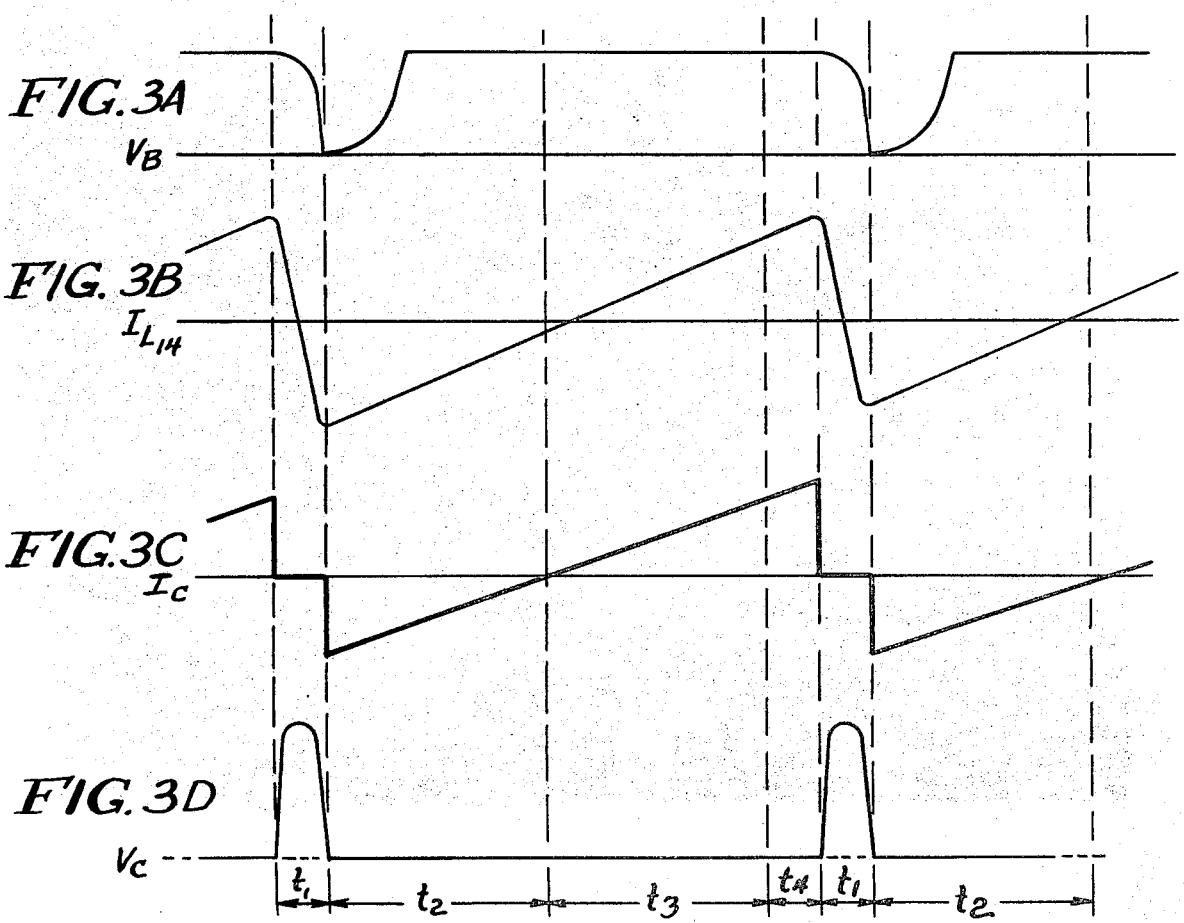

SELF-OSCILLATING POWER SUPPLY

BACKGROUND OF THE INVENTION

This invention generally relates to self-oscillating circuits and more specifically is directed to a free-running circuit particularly adapted for providing a periodic, pulsed output voltage.

In general, video information is displayed by a television receiver or a raster which is scanned horizontally at a first rate and scanned vertically at a second, generally slower rate. The received video information is presented as amplitude-modulated synchronizing pulses by which the raster scanning of the television receiver is synchronized with the information to be viewed. For proper picture framing, it is required that the horizontal sweep system be synchronized in frequency and phase of oscillation with the horizontal synchronizing signal transmitted from the broadcast station. This synchronization requirement is applicable not only in television receivers where the standardization of television waves establishes a predetermined relationship between horizontal and vertical synchronizing signals, but also in a video display as used in a computer terminal or in a data display presentation system which may be required to interface with a great variety of input synchronization signals.

Deflection circuits utilized in television receivers, and in CRT video displays in general, synchronize the deflection signals used to control the sweep of the electron beam therein with synchronizing pulses recovered from the composite video signal received by the television receiver or generated in the video display. The synchronized signals are typically generated by the charge-discharge cycle of a capacitor in generating a sawtooth current waveform having a predetermined period and magnitude. The ramp of the sawtooth current waveform is generally developed from the discharge of a capacitor while the capacitor is recharged during the retrace period. This sawtooth current waveform is applied to the CRT's deflection coils in causing the electron beam to sequentially and repetitively scan and retrace over the face plate of the CRT at the appropriate times.

The prior art discloses various approaches to deflection circuit design and, in particular, synchronization oscillator design to achieve synchronization of electron beam sweep with input synchronization pulses. Early attempts in this area utilized switching diodes in combination with a voltage source to alternately charge and discharge a capacitor. Later efforts employed switching transistors in CRT sawtooth current waveform generation circuits which resulted in improvements in switching speeds and power consumption. Still later work in this area gave rise to the development of silicon controlled rectifier (SCR) circuits formed of a semi-conductor assembly controlled by signals of small magnitude applied to a control electrode, or gate, and capable of operating at higher currents than that of normal rectifiers. The transistor and SCR CRT drive circuits, which generally took the form of multivibrator circuit combinations, were not without limitations. Transistorized multivibrators tended to be overly complicated while SCR oscillators suffered from instabilities, or drift, in the signal voltage levels required to initiate the transition to a stable oscillating state as well as requiring an outside source of high power signals to terminate the SCR's oscillatory state.

One example of an oscillator employed in the horizontal drive circuit of a video display is disclosed in U.S. Pat. No. 4,263,615 to Beaumont and Steinmetz. In this approach a variable time delay monostable multivibrator is triggered by the leading edge of the horizontal drive pulse, the clocked output signal of which is coupled to a precision astable multivibrator. Potentiometer adjustment of the monostable multivibrator provides for adjusting video information position with respect to raster scan while the astable multivibrator acts as the oscillator in synchronizing horizontal sweep circuitry to the horizontal input drive signal. The astable multivibrator is a free-running oscillator which oscillates at whatever frequency it is designed for until it receives an input synchronization signal, at which time it locks onto the frequency of the input synchronization signal which may be different that its original frequency. U.S. Pat. No. 4,253,117 to Kadlec discloses a system for increasing synchronization signal injection to a free-running multivibrator in the horizontal drive circuit of a video display for enhancing synchronization signal frequency capture range. By increasing sync signal frequency capture range, this system permits a video display such as used in a computer terminal or a data display presentation system to interface with a great variety of input sync signals. Another example of an oscillating circuit utilized in a video display is provided in U.S. Pat. No. 4,234,828 to Matthews wherein is disclosed an SCR-analogue dual coupled transistor vertical oscillator for synching the vertical sweep in a video display with a vertical synchronization input signal. This approach makes use of a coupled transistor configuration in combination with a capacitor for generating a precisely defined sawtooth voltage waveform for controlling vertical sweep and flyback with stable, free-running oscillation availabe at two, variable DC levels. The aforementioned systems involve the use of a multi-transistor multivibrator arrangement or a multi-transistor SCR analogue circuit arrangement for providing an oscillating output in response to a synchronization signal input.

The aforementioned self-oscillating circuits are responsive to sync signal inputs for driving a high voltage supply in the video display for controlling electron beam intensity and position therein. The high voltage power supply typically includes an isolation transformer. An example of a power supply designed for use in a television receiver is disclosed in U.S. Pat. No. 3,845,352 to Newman et al wherein the vertical deflection windings of the television receiver are coupled directly to the output of a push-pull amplifier comprising a complementary pair of electronic devices. Bipolar voltages for driving the complementary pair are derived from horizontal scanning signals by a pair of oppositely-poled secondary windings on the horizontal output transformer, or high voltage power supply. The unregulated high voltage input is thus controlled by the horizontal drive system for providing appropriate timing signals to horizontal deflection circuitry for controlling electron beam position on the face plate of the CRT. U.S. Pat. No. 4,261,032 to Cavigelli discloses a self-oscillating, high voltage DC power supply for a CRT. A charging circuit for an oscillator coil within the high voltage power supply is provided by means of a DC supply and a switching transistor connected between the coil and ground. A feedback coil inductively coupled to the oscillator coil and wound in the opposite direction is incorporated in the base drive circuit of the transistor switch. The feedback coil operates to open the switch by means of a current induced in the base drive circuit when the current in the feedback circuit reaches a predetermined level related to the current in the oscillator coil primary in regulating transistor operation.

The self-oscillating circuits and sawtooth generating high voltage supplies described above all make use of a plurality of inductively coupled transformer coils and/or multi-transistor multivibrating circuits. The present invention is intended to eliminate the complexity and expense of these approaches by providing a self-oscillating circuit comprised of a single transistor and a pair of isolated coils, one of which may be utilized as the primary of a high voltage sweep transformer to drive the CRT of a video display.

OBJECTS OF THE INVENTION

Accordingly, it is an object of the present invention to provide an improved transistorized, self-oscillating, resonant circuit.

It is another object of the present invention to provide an improved self-oscillating circuit particularly adapted for use in a power supply for producing precisely controlled, periodic, high voltage output pulses.

Still another object of the present invention is to provide a free-running oscillator particularly adapted for driving cathode ray tube sweep circuitry in a video display.

A further object of the present invention is to provide an improved self-oscillating, high voltage DC power supply for energizing electronic apparatus such as cathode ray tubes and the like.

BRIEF DESCRIPTION OF THE DRAWINGS

The appended claims set forth those novel features believed characteristic of the invention. However, the invention itself as well as further objects and advantages thereof will best be understood by reference to the following detailed description of a preferred embodiment taken in conjunction with the accompanying drawings, in which:

FIG. 1 is a circuit diagram of a self-oscillating circuit in accordance with the present invention;

FIG. 2 is a schematic diagram of an equivalent circuit corresponding to the circuit of FIG. 1;

FIGS. 3A-3D show a set of waveforms indicating the current and voltage at several points in the self-oscillating circuit of FIG. 1; and FIG. 4 is a circuit diagram showing a high voltage power supply utilizing a self-oscillating circuit in accordance with the present invention particularly adapted for use in driving a CRT in a video display system.

DESCRIPTION OF THE PREFERRED EMBODIMENTS

Referring to FIG. 1, there is shown a self-oscillating circuit 10 in accordance with the present invention. A direct voltage source, designated B+, is coupled via an inductance 14 to the collector of an NPN transistor 12. The emitter of the NPN transistor 12 is grounded, while its base is connected to ground via the serial combination of resistance 16 and inductance 18. The junction of the collector of transistor 12 and inductance 14 is coupled to neutral ground potential by means of capacitance 20.

The operation of the self-oscillating circuit of FIG. 1 will now be explained in terms of FIGS. 3A through 3D wherein are shown the current and voltage in various locations of the circuit of FIG. 1 at various times. With regard to the time intervals shown in FIGS. 3A-3D, $t_1$ represents the width of the high voltage pulse produced by self-oscillating circuit 10, where $t_1 = \pi\sqrt{L_{14}C_{20}}$. $t_2$ represents the time for the inductive energy stored in inductance 14 to be transferred via ground to inductance 18. $t_3$ represents the period during which transistor 12 is rendered conducting by the current flow through grounded inductance 18. $t_4$ represents the charge storage time of transistor 12 for the time between the end of current flow in the self-oscillating circuit and transistor turn-off.

A B+ VDC source is coupled via inductance 14 to the collector of transistor 12. An oscillator start signal is provided to the base of transistor 12 by means of an oscillator start pulse source 24 which may be conventional in design and does not form a part of the present invention. Any conventional pulse source could be utilized in the present invention and is required only to initiate circuit oscillation. Once self-oscillating circuit 10 is in an oscillating mode with a direct voltage source coupled thereto as shown in FIG. 1, it is capable of self-oscillation and the source of pulsed drive inputs thereto may be removed. Although FIG. 1 shows the start pulse source coupled to the base of transistor 12, oscillation of the circuit may be initiated in a variety of ways. For example, a switched input, as via a switching transistor, may be provided to the collector of transistor 12 for initiating pulsed conduction therein. Similarly, inductance 18 could be incorporated as the secondary winding of an input transformer through which an input pulse could be coupled to the base of transistor 12 for rendering it conducting and starting the oscillatory action of the circuit. In addition, a second transistor (not shown) could be connected in series with inductance 18 and transistor 12 and utilized as a switched input device for providing synchronizing pulses to the base of transistor 12 to provide for the synchronous operation of the self-oscillating circuit 10.

Following application of an intialization pulse to transistor 12, current flows through inductance 14 from the B+ voltage source through transistor 12 to ground. The collector current ramps up, flowing through inductance 14 and storing energy therein. Following removal of the input drive pulse from the base of transistor 12, the collector current will go to zero and a large DI/DT (the change in current with time) across inductance 14 will result in a large voltage spike being generated on the collector of transistor 12 as shown in FIG. 3D.

The voltage spike produced on the collector of transistor 12 causes inductance 14 to become a voltage source in series with the B+ source resulting in the generation of a high potential. The network comprised of inductance 14 and capacitor 20 attempts to resonate with current flowing from ground to the B+ voltage source. However, when the collector voltage attempts to go negative, the base-collector junction of transistor 12 acts as a diode in clamping the collector voltage to zero and prohibiting the aforementioned LC network from resonating. This causes the energy stored in inductance 14 to flow in the form of current through the B+ supply via ground through inductance 18 and resistance 16 to the base of transistor 12. This current reversal in inductance 14 and the collector of transistor 12 is shown in FIGS. 3B and 3C, respectively. The aforementioned current conduction path causes energy to be transferred from inductance 14 via ground to inductance 18. The base-collector junction of transistor 12 thus provides the current path for the aforementioned energy transfer. The discharge of energy stored in inductance 14 causes a base drive current to be applied to transistor 12 via inductance 18. A current provided by inductance 18 via resistance 16 to the base of transistor 18 turns transistor 12 on, allowing current to flow once again from the B+ source through inductance 14 to ground via the emitter of transistor 12. This current conduction path results in the re-storing of energy in inductance 14. Thus, with the base drive current provided from inductance 18 to transistor 12, the base-collector junction thereof becomes reversed biased thus allowing current to flow from the B+ source to ground via transistor 12. When the energy stored in inductance 18 is depleted to the point where it is no longer sufficient to drive the base of transistor 12, transistor 12 stops conducting, a voltage spike again occurs on the collector of transistor 12, and the oscillatory cycle of the circuit is repeated with current flowing from inductance 14 to the B+ source and thence to inductance 18 via ground.

Referring to FIG. 2, there is shown the equivalent circuit of the self-oscillating circuit of FIG. 1 for the period when current flows from the transistor's collector to the B+ source, or during $t_2$. The base-collector junction of transistor 12 of FIG. 1 is shown in FIG. 2 as a diode 22. Following the application of an oscillation initiating signal to the transistor's base, the transistor (not shown in FIG. 2) is rendered conducting. Current will then flow through forward-biased diode 22 as shown by the direction of the arrow in FIG. 2. Energy is transferred from inductance 14 through the B+ source via ground to inductance 18. By means of forward biased diode 22, energy is transferred from inductance 18 to inductance 14. When the output of inductance 18 reduces to the point where diode 22 becomes reversed biased, current stops flowing as shown in FIG. 2 and the output of the B+ source is again stored in inductance 14. After a predetermined time interval as established by the time constant of capacitance 20, the current through inductance 14 reverses and current again flows through the B+ source via ground to inductance 18 and the resonant cycle is initiated once again.

As preferably utilized in energizing a cathode ray tube (CRT) in a video display system, inductance 14 may be either the primary winding of a high voltage transformer or a deflection yoke, either horizontal or vertical, for directly controlling electron beam position within the CRT. The present invention thus has application not only as a self-oscillating circuit, but also may be used as an integral part of a pulsed power supply as used for energizing a CRT. When employed in a high voltage pulsed power supply, a preferred embodiment of the present invention is shown in FIG. 4.

Referring to FIG. 4, where like components have similar identifying numbers as used in FIGS. 1 and 2, there is shown a self-oscillating power supply 26 in accordance with the present invention. The high voltage power supply 26 includes a transformer 28 having a primary winding 14 and two secondary windings 30, 32. A B+ voltage source energizes primary winding 14 with NPN transistor 12 coupled to the opposite end thereof. Transistor 12, inductive coil 14, resistance 16, grounded inductance 18, and grounded capacitance 20 operate in the power supply 26 of FIG. 4 as previously described with reference to the self-oscillating circuit 10 of FIG. 1. Thus, a start pulse is provided to the base of transistor 12 via current limiting resistance 42 from PNP transistor 40 to which $V_{IN}$ is provided from a conventional DC source (not shown). With NPN transistor 12 conducting, current flow is from the B+ source through inductance 14 and transistor 12 to ground. When the initialization pulse is removed from the base of transistor 12, this transistor stops conducting. A voltage peak then occurs on the collector of transistor 12 and energy stored in inductance 14 is released in the form of current flowing through the B+ source and thence via ground and the serial combination of inductance 18 and resistance 16 to the base of transistor 12. The energy build-up in inductance 18 is eventually discharged to the base of transistor 12 resulting in its turn-on and current again flows from the B+ source via inductance 14 and transistor 12 to ground. When the output of inductance 18 reduces to a level no longer able to maintain transistor 12 in a conducting state, a high voltage pulse again occurs on the collector of transistor 12, causing energy to be released from inductance 14 and the oscillatory cycle of the circuit to be re-initiated. The oscillatory period of the circuit is established by the value of grounded capacitance 20, while resistance 16 performs a current limiting function with respect to the base of transistor 12.

Transformer 28 includes a second secondary coil 32 from which the high voltage $V_{OUT}$ signal is derived for energizing the driven device. Grounded capacitance 34 and diode 33 provide for the filtering and rectification of the $V_{OUT}$ signal.

Transformer 28 further includes a first secondary coil 30 which is inductively coupled to and energized by the primary, inductive winding 14. When a voltage is induced in the first secondary coil 30 due to changing current in the primary, inductive winding 14, a signal is provided to the base of start-up transistor 40 which operates as a start-up switch. The signal provided to the base of start-up transistor 40 is filtered and rectified by means of the combination of diode 36 and grounded capacitance 38. Start-up transistor 40 is biased off after providing the initial start-up pulse to the base of transistor 12 when an output signal is provided to the base thereof by the first secondary winding 30. Thus, after the delivery of the initial start-up pulse to the base of transistor 12, and in response to current flow in primary inductive coil 14, start-up transistor 40 is turned off by means of a biasing signal provided to its base from secondary transformer coil 30 inductively coupled to the primary coil 14 of the transformer.

There has thus been disclosed a self-oscillating circuit particularly adapted for use in an oscillating power supply as employed in driving a CRT in a video display system. This self-oscillating circuit utilizes a minimum number of components, requires only a start-up input pulse, and delivers precisely regulated, high voltage output pulses.

While particular embodiments of the present invention have been shown and described, it will be apparent to those skilled in the art that changes and modifications may be made therein without departing from the invention in its broader aspects. The aim in the appended claims, therefore, is to cover all such changes and modifications as fall within the true spirit and scope of the invention.

I claim:

1. A self-oscillating circuit wherein the oscillation thereof is initiated by receipt of an initialization signal from an initialization signal source, said circuit comprising:
- a grounded DC voltage source;
- transistor means operable in a first conducting mode and a second nonconducting mode, said transistor means coupled to said initialization signal source for conducting current upon receipt of an initialization signal therefrom;
- a first inductor coupling said DC voltage source and said transistor means wherein energy is stored in said first inductor when said transistor means is rendered conducting following receipt of an initialization signal and energy is released therefrom following turn-off of said transistor means;
- a second, grounded inductor in circuit with said first inductor and coupled by ground thereto and further coupled to said transistor means for storing the energy released by said first inductor by means of current flowing via ground from said first to said second inductor following the turn-off of said transistor means and providing said energy to said transistor means whereby said transistor means is again rendered conductive and energy is again stored in said first inductor in continuing the oscillation of said circuit; and
- capacitor means coupling the junction of said first inductor and said transistor means to neutral ground potential, with the value of said capacitor means establishing the frequency of oscillation of said circuit.

2. The circuit of claim 1 wherein said transistor means comprises an NPN transistor including a collector coupled to said first inductor, a base coupled to said initialization signal source and said second inductor, and a grounded emitter.

3. The circuit of claim 2 further including resistor means coupling said second inductor to the base of said NPN transistor for limiting the current provided thereto.

4. The circuit of claim 1 wherein said initialization signal source is coupled to the base of said transistor means for providing said initialization signal thereto.

5. The circuit of claim 1 wherein said initialization signal source includes the combination of a third inductor inductively coupled to said first inductor and second transistor means coupled to said first transistor means for providing said initialization signal thereto.

6. The circuit of claim 1 wherein said first inductor forms a primary coil of a high voltage transformer for generating a high voltage pulsed output therefrom.

7. A self-oscillating high voltage, pulsed power supply comprising:
- a grounded, first DC voltage source;
- first transistor means operable in a first conducting mode and a second nonconducting mode;
- transformer means having a primary winding coupling said DC voltage source and said first transistor means and including first and second secondary windings inductively coupled to said primary winding, wherein energy is stored in said primary winding when said first transistor means is in said first conducting mode and energy is released therefrom when said first transistor means is in said second nonconducting mode with a high voltage output pulse provided to said second secondary coil when said first transistor means is in said second nonconducting mode;
- initialization signal source means coupling said first secondary winding to said first transistor means for providing an initialization pulse thereto in response to said DC voltage source causing current to flow in the primary winding of said transformer means;
- grounded inductor means in circuit with said primary winding of said transformer means and coupled by ground thereto and further coupled to said first transistor means for storing the energy released by said primary winding when said first transistor means is in said second nonconducting mode and providing said energy to said first transistor means whereby said first transistor means is again rendered conducting with energy again stored in said primary winding for continuing the oscillation of said power supply; and
- capacitor means coupling the junction of said primary winding and said first transistor means to neutral ground potential, with the value of said capacitor means establishing the length of said high voltage output pulse.

8. The power supply of claim 7 wherein said first transistor means comprises an NPN transistor having a collector coupled to said primary winding, a base coupled to said initialization signal source means and said grounded inductor means, and a grounded emitter.

9. The power supply of claim 7 wherein said initialization signal source means includes the combination of a second DC voltage source and second transistor means coupled to said first secondary winding wherein said second transistor means is rendered conductive by said output pulse and is nonconductive in the absence of an output pulse from said first secondary winding.

10. The power supply of claim 7 further including a filter/rectifier network coupling said first secondary coil and said initialization signal source means.

11. The power supply of claim 7 further including resistor means coupling said grounded inductor means to said first transistor means for limiting the current provided thereto.

* * * * *